(12) United States Patent  
Bagheri et al.

(10) Patent No.: US 8,495,528 B2
(45) Date of Patent: Jul. 23, 2013

(54) METHOD FOR GENERATING A PLURALITY OF OPTIMIZED WAVEFRONTS FOR A MULTIPLE EXPOSURE LITHOGRAPHIC PROCESS

(75) Inventors: Saeed Bagheri, Croton on Hudson, NY (US); Kafai Lai, Poughkeepsie, NY (US); David O. Melville, New York, NY (US); Alan E. Rosenbluth, Yorktown Heights, NY (US); Kehan Tian, Poughkeepsie, NY (US); Jaione Tirapu Azpiroz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 337 days.

(21) Appl. No.: 12/890,854

(22) Filed: Sep. 27, 2010

(65) Prior Publication Data

US 2012/0077130 A1 Mar. 29, 2012

(51) Int. Cl.
*G06F 17/50* (2006.01)

(52) U.S. Cl.
USPC .............................................. 716/54; 716/50

(58) Field of Classification Search
USPC .......................................................... 716/54
See application file for complete search history.

(56) References Cited

U.S. PATENT DOCUMENTS

| 5,317,450 | A  | 5/1994  | Kamon |
| 5,946,079 | A  | 8/1999  | Borodovsky |
| 6,822,728 | B2 | 11/2004 | McCullough et al. |
| 6,951,701 | B2 | 10/2005 | Hsu et al. |
| 7,095,481 | B2 | 8/2006  | Morohoshi |
| 7,230,682 | B2 | 6/2007  | Shimizu et al. |
| 7,583,360 | B2 | 9/2009  | Fritze et al. |
| 2003/0123039 | A1 | 7/2003 | Yen et al. |
| 2008/0052334 | A1 | 2/2008 | Yamazoe |
| 2011/0230999 | A1* | 9/2011 | Chen et al. ................. 700/105 |

OTHER PUBLICATIONS

Rosenbluth, Alan; Bukofsky, Scott; Fonseca, Carlos; Hibbs, Michael; Lai, Kafai; Molless, Antoinette; Singh, Rama; Wong, Alfred; "Optimum mask and source patterns to print a given shape," 2002, Society of Photo-Optical Instrumentation Engineers.*

Rosenbluth, Alan; Melville, David; Tian, Kehan; Lai, Kafai; Seong, Nakgeuon; Pfeiffer, Dirk; Colburn, Matthew; "Global Optimization of Masks, Including Film Stack Design to Restore TM Contrast in High NA TCC's," 2007, SPIE.*

(Continued)

*Primary Examiner* — Jack Chiang
*Assistant Examiner* — Eric Lee
(74) *Attorney, Agent, or Firm* — Scully, Scott, Murphy & Presser, P.C.; Parashos Kalaitzis, Esq.

(57) ABSTRACT

A simplified version of a multiexpose mask optimization problem is solved in order to find a compressed space in which to search for the solution to the full problem formulation. The simplification is to reduce the full problem to an unconstrained formulation. The full problem of minimizing dark region intensity while maintaining intensity above threshold at each bright point can be converted to the unconstrained problem of minimizing average dark region intensity per unit of average intensity in the bright regions. The extrema solutions to the simplified problem can be obtained for each source. This set of extrema solutions is then assessed to determine which features are predominantly printed by which source. A minimal set of extrema solutions serves as a space of reduced dimensionality within which to maximize the primary objective under constraints. The space typically has reduced dimensionality through selection of highest quality extrema solutions.

20 Claims, 4 Drawing Sheets

OTHER PUBLICATIONS

Rosenbluth, A.E. et al., "Optimum Mask and Source Patterns to Print a Given Shape" JM3 (2002) pp. 13-30, vol. 1 (1).

Rosenbluth, A.E. et al., "Global Optimization of Masks, Including Film Stack Design to Restroe TM Contrast in High NA TCC'S" Proc. of SPIE Optical Microlithography (2007) pp. 65200P-1-65200P-13, vol. 6520.

Rosenbluth, A.E. et al., "Global Optimization of the Illumination Distribution to Maximize Integrated Process Window" Proc. of SPIE Optical Microlithography (2006) pp. 61540H-1-61540H-12, vol. 6154.

Rosenbluth, A.E. et al., "Intensive Optimization of Masks and Sources for 22nm Lithography" Proc. of SPIE Optical Microlithography (2009) pp. 727409-1-727409-15, vol. 7274.

* cited by examiner

METHOD FOR GENERATING A PLURALITY OF OPTIMIZED WAVEFRONTS FOR A MULTIPLE EXPOSURE LITHOGRAPHIC PROCESS

BACKGROUND

The present disclosure relates to lithographic methods, and particularly to a method for generating a plurality of optimized wavefronts for a lithography process.

Printing state-of-the-art circuit patterns with available image-forming technology poses an important challenge for the semiconductor industry. For production costs to be viable the images must be formed with radiation whose wavelength is compatible with practical lenses (for example refractive lenses), and this limits the fundamental resolution of the image. It then becomes desirable to optimize the patterns on the masks which the imaging lenses project on the wafer as a means of forming the circuit pattern image, in order that the available resolution be exploited as fully as possible.

In the case where a single mask is projected to a wafer to form the circuit image (in a particular level), A. E. Rosenbluth, S. Bukofsky, C. Fonseca, M. Hibbs, K. Lai, A. Molless, R. N. Singh, and A. K. K. Wong, "Optimum Mask and Source Patterns to Print a Given Shape," JM3 1, no. 1 (2002): p. 13, which is incorporated herein by reference, shows that a suitably patterned mask can be obtained by first determining the optimum set of image forming waves that should be diffracted from the mask under irradiation by the (shaped) illumination source, and then designing manufacturable mask shapes to produce these diffracted waves. The problem of determining the optimal image-forming waves to diffract from the mask is a challenging one because it involves non-convex constraints in a high-dimensioned solution space, with the nominal scaling of the problem difficulty being exponential in the number of dimensions. Further, it has been shown that for a single advanced mask (in particular a phase-shift mask) the dimensionality can be reduced by first solving an averaged version of the problem to reduce the dimensionality, and then applying heuristics to find the solution within the reduced space.

A drawback to this prior-art method is that the shaped illumination source must illuminate all patterns in the mask, implying that those features in the shaped illumination source which are only well-suited to printing a limited subset of the desired circuit features must nonetheless illuminate all patterns in the mask, including those associated with high-quality printing of other mask features. The shapes in the illumination source pattern must then be chosen as a compromise.

It is known in the art that where general lithographic imaging is concerned, one can improve the quality of the circuit image by dividing the source shapes and mask shapes into two or more separate exposures (applied sequentially), so that after the mask shapes have been deployed across separate masks, each appropriate subset of the source shapes need only expose a mask which includes mask patterns that the subset of source shapes is well-suited to project, with other mask patterns being deployed to masks exposed by other subsets of the source shapes. For example, a technique known as double exposure in the art employs two separate sequential exposures of the same photoresist layer using two different photomasks. Double exposure allows the decomposition of two-dimensional patterns into two patterns which are easier to print. When two masks are used each individual mask has more space available to deploy enlarged serifs and assisting structures that aid printing. Although the use of multiple masks is costly, the practice has now become accepted (within limits) because of the extreme difficulty in printing the patterns for state-of-the-art circuits.

However, a drawback of the multiple mask approach is that the use of multiple masks increases the dimensionality of the mask design problem (in proportion to the number of masks used), or equivalently it increases the number of degrees of freedom which should be optimally exploited when determining the diffracted wavefronts from the two or more masks. Sub-optimal heuristics are often accepted that shirk optimization of the expanded degrees of freedom, through a process known as pattern decomposition. Pattern decomposition uses pre-assignment to decompose the multiple exposure back to a set of separated single exposures, for example using the heuristic of pre-assigning horizontally oriented features to an exposure with one source, and vertically oriented features to exposure with another.

In addition, modern circuit features are so fine that it can be desirable to use masks of the simplest kind, such as masks whose patterns consist of simple apertures in a comparatively thin set of opaque films, because the more complex mask topographies that are needed to support more advanced mask functionalities like phase-shifting can in practice introduce severe distortions with features of such extreme fineness. Although it is known that the optimal phase-shifted wavefront may (with a single mask, in the prior art) be obtainable from a space of reduced dimensionality, that reduced space may be too severely restricted to provide useful wavefronts from a mask that cannot employ phase shift.

In addition, when determining the imaging wavefronts it is preferable to take into account the possible positioning errors that can occur when exposures are superposed in a multiple exposure process, and this adds an additional complication to the problem.

Multiple exposure is well-known as a general technique for exposing wafers. Most steps of source mask optimization ("SMO") for single exposure can be extended to multiple exposures in a fairly straightforward way, except for mask optimization, which on its face is more difficult to carry out optimally with more than one exposure.

BRIEF SUMMARY

A method for mask optimization with multiple exposure is provided in this disclosure. Specifically, a simplified version of a multiexpose mask optimization problem is solved in order to find a compressed space in which to search for the solution to the full problem formulation. The simplification is to reduce the full problem to an unconstrained formulation. The full problem of minimizing dark region intensity while maintaining intensity above threshold at each bright point can be converted to the unconstrained problem of minimizing average dark region intensity per unit of average intensity in the bright regions. The extrema solutions to the simplified problem can be obtained for each source. This is accomplished without pre-assigning features to a particular exposure. This set of extrema solutions is then assessed to determine which features are predominantly printed by which source. A minimal set of extrema solutions serves as a space of reduced dimensionality within which to maximize the primary objective under constraints. The space typically has reduced dimensionality through selection of highest quality extrema solutions. The dimensionality tends to scale primarily with the number of bright points in the pattern, rather than with the number of exposures used.

When an optimization problem is unconstrained, the solution is found at a point where the derivatives with respect to all variables are zero. This is not the case, however, when the optimization problem has constraints, as the full problem of interest does here. Saddle point solutions, which are found by simply setting the derivatives to zero, are still a useful component of the solution to the full problem. This is because a binding constraint present in the full problem will block off part of the parameter space along the dimension where the saddle point has a maximum (i.e., a superior point) in its cross-section.

A particular dimension should be considered which includes combinations (mixtures) of at least two basis solutions to the unconstrained problem, namely 1) a saddle-point solution, and 2) a solution which is fully a maximum along every dimension. Thus, when full-problem solutions are searched along that particular dimension, then a desirable mixture can be found that just passes inside the boundary where a constraint to the full problem blocks off part of the parameter space. The two or more basis solutions of the mixture (which are extremum solutions of the unconstrained problem) thus represent useful search dimensions for the full problem.

In one embodiment, a central step can be interpreted in a different way, namely that the unconstrained problem is essentially the average of the full problem. More specifically, the full problem, which is to minimize dark region intensity while maintaining intensity above threshold at each bright point, is converted to the unconstrained problem of minimizing average dark region intensity per unit of average intensity in the bright regions.

The extrema solutions to the simplified problem can be obtained for the combined image. In one embodiment, these extrema solutions for the combined image are also extrema solutions for exposures with the individual sources. This is accomplished without pre-assigning features to a particular exposure. The quality with which these extrema solutions print the individual features of the image (the bright features) is then evaluated according to criteria like contrast, and a minimal set of extrema solutions from the multiple sources is identified. This minimal set is essentially chosen in such a way as to include whichever extremum solution (from across all sources) is best at printing each one of the bright features. The minimal set then tends to scale primarily with the number of bright points in the pattern, rather than with the number of exposures used. The dimensionality of this minimal set thus does not tend to increase when multiple exposures are used, easing the design of the multiple masks.

This set of extrema solutions is then assessed to determine which features are predominantly printed by which source, and on this basis a reference source is chosen as the source whose worst-covered feature is better covered (in a predominant sense) than is the worst-covered feature in all the other sources. The coverage provided by the other (non-reference) sources is then downgraded to take into account the fact that the images they provide may be misaligned relative to the image produced by the reference source. A new minimal set of extrema solutions is then obtained by reapplying the coverage criteria with the effect of potential overlay error now taken into account.

The above steps may be carried out using any kind of mask technology, including phase shift masks. A third expanded selection step may also be carried out on each portion of the extrema solutions that is obtained from the same source. This third step can be of particular value if phase shift masks are not being employed. This step is undertaken to ensure that bright sample points can be covered with amplitude that is positive-signed, since the masks would typically have to employ phase shift if they needed to transmit substantial negative amplitude.

After the final selection steps are completed the minimal set of extrema solutions then serves as a space of reduced dimensionality within which to maximize the primary objective under constraints. The space typically has reduced dimensionality because only the highest quality extrema solutions will generally be selected.

According to an aspect of the present disclosure, a method for designing mask transmitted wavefronts for use in a multiple exposure lithographic process is provided. The method includes: selecting a set of bright evaluation points and a set of dark evaluation points in an exposure plane for a multiexposure lithographic process including a set of illumination sources and a set of basis components of candidate wavefronts for each source to be used in forming an image at the set of bright evaluation points and the set of dark evaluation points;

generating a set of relationships between intensities of the set of bright evaluation points and the set of dark evaluation points and weights of the set of basis components of candidate wavefronts; generating a primary objective function expressing a first merit quality for the intensities at the set of bright evaluation points and at the set of dark evaluation points, wherein constraint functions applied during the generating are functions of the weights of the set of basis components of the candidate wavefronts; transforming the primary objective function and the constraint functions into a secondary objective function that does not include constraints;

determining extrema solutions for the secondary objective function; expressing the primary objective function employing the extrema solutions as a new set of basis components;

calculating an optimal wavefront by finding weights for the new set of basis components through minimizing the primary objective function; and generating a design for a set of masks, wherein the set of masks generate the optimal wavefront during exposure when illuminated by the illumination sources.

According to another aspect of the present disclosure, a method of forming a lithographic pattern on a substrate is provided. The method includes: selecting a set of bright evaluation points and a set of dark evaluation points in an exposure plane for a multiexposure lithographic process including a set of illumination sources and a set of basis components of candidate wavefronts for each source to be used in forming an image at the set of bright evaluation points and the set of dark evaluation points; generating a set of relationships between intensities of the set of bright evaluation points and the set of dark evaluation points and weights of the set of basis components of candidate wavefronts; generating a primary objective function expressing a first merit quality for the intensities at the set of bright evaluation points and at the set of dark evaluation points, wherein constraint functions applied during the generating are functions of the weights of the set of basis components of the candidate wavefronts; transforming the primary objective function and the constraint functions into a secondary objective function that does not include constraints; determining extrema solutions for the secondary objective function; employing the extrema solutions as a new set of basis components to express the primary objective function; calculating an optimal wavefront by finding weights for the new set of basis components through minimizing the primary objective function; generating a design for a set of masks, wherein the set of masks generate the optimal wavefront during exposure when illuminated by the illumination sources; and lithographically patterning a photoresist on a substrate, wherein the photoresist is patterned by employing multiple exposures in which at least two mask among the set of masks are employed.

DETAILED DESCRIPTION

Figure 1:
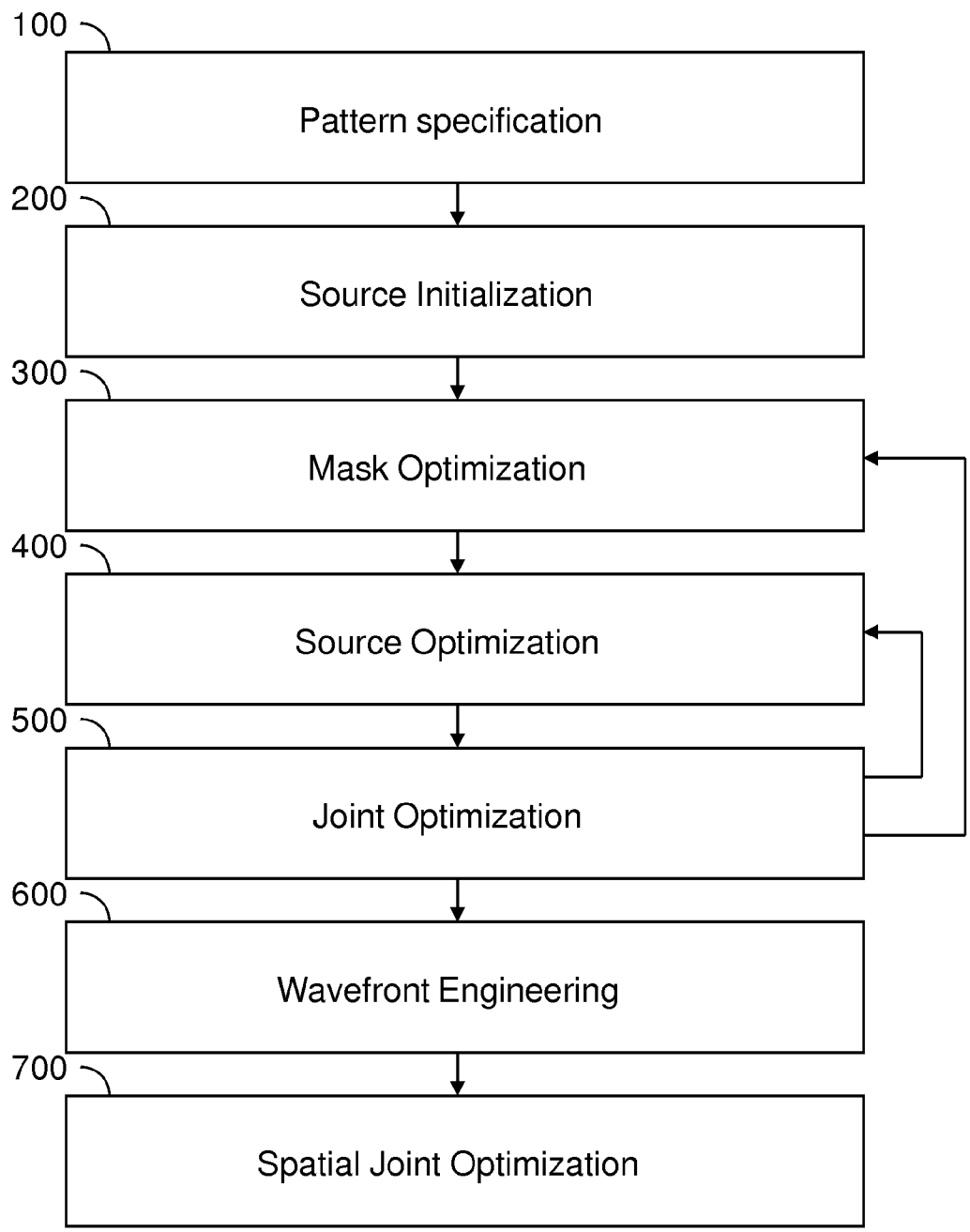
FIG. 1 is a flow chart outlining a source mask optimization (SMO) process according to an embodiment of the present disclosure.

As stated above, the present disclosure relates to a method for generating a plurality of optimized wavefronts for a multiple exposure lithography process, which is now described in detail with accompanying figures. It is noted that like and corresponding elements are referred to by like reference numerals.

As used herein, "lithographic fabrication" refers to formation of a lithographic image by at least one exposure step and at least one development step, which may potentially be a self-developing step occurring upon exposure.

As used herein "multiexposure lithography" refers to a lithographic process that employs multiple masks to provide multiple exposure of a same photoresist to form a single lithographic pattern therein.

As used herein, a "source" or an "illumination source" refers to a device configured to emit radiation for the purpose of lithographic exposure.

As used herein, a "source shape" refers to the directional shape of the illumination that is provided by a lithographic source for lithographic exposure. Because the source shape is the only variable in a lithographic source for the purposes of this disclosure, the configuration of a source, i.e., a lithographic source, is determined by selecting a source shape.

As used herein, a "mask," a "physical mask," or a "lithography mask" refers to a template used in photolithography that allows selective exposure of a photosensitive surface through patterned layers included therein and having a different transmission than a background layer, such as a different opacity or a different phase shift.

As used herein, "optical proximity correction" refers to a photolithography enhancement technique used to compensate for image errors due to diffraction or process effects.

As used herein, a "source direction" refers to a direction from which a beam of light with controlled intensity is made to illuminate a lithographic mask.

As used herein, a "clip" or a "circuit clip" refers to a separate set of features in a semiconductor circuit.

As used herein, a "mask clip" refers to features on one of the masks used to form a circuit clip.

As used herein, "source optimization" refers to optimization of a source shape.

As used herein, "mask optimization" refers to selection of optimal image forming waves for each mask to be employed to form a lithographic pattern.

As used herein, "joint optimization" refers to optimization of both mask patterns and source shape.

As used herein, a "spatial joint optimization" refers to optimization of source shape together with mask patterns which take the form of apertures in a mask substrate.

As used herein, an "image forming wave" refers to a component, such as a plane-wave component, in light that forms an image.

As used herein, a "wavefront" refers to the amplitude distribution created across a reference surface due to propagation of a light distribution through the surface. The light distribution in question may constitute only a portion of a more intense light distribution.

As used herein, a "candidate wavefront" refers to a wavefront which might be chosen to serve as an imaging wavefront.

As used herein, an "eigenvector" refers to a vector that, upon multiplication with an associated matrix, produces a scalar multiple of the original vector. The scalar multiplier is the associated eigenvalue.

As used herein, a "joint eigenvector" refers to a vector that is an eigenvector of two different matrices, in particular in a basis where one matrix is scaled to have unit eigenvalues. The eigenvalues of the other matrix are referred to as joint eigenvalues.

As used herein, a "basis component" refers to a portion of a candidate wavefront whose amplitude is set to a fixed relative distribution, but whose weight can be adjusted to vary the candidate wavefront.

As used herein, a "bright sample point" or a "bright evaluation point" refers to a point located in the bright region of an image pattern, at which the character of the image is assessed.

As used herein, a "dark sample point" or a "dark evaluation point" refers to a point located in the dark region of an image pattern, at which the character of the image is assessed.

As used herein, a "sample point" or an "evaluation point" refers to a point of an image pattern, at which the character of the image is assessed.

As used herein, a "bright region" refers to a region of an image pattern that is intended to be brighter than the exposure threshold of the resist.

As used herein, a "dark region" refers to a region of an image pattern that is intended to be darker than the exposure threshold of the resist.

As used herein, an "intensity matrix" refers to a matrix which when used as a quadratic form provides an intensity that is produced by a given set of weights for the basis components of a candidate wavefront.

As used herein, an "average matrix" refers to a matrix obtained by taking a mathematical average of other matrices component by component.

As used herein, a "pocket search" refers to a search for a locally optimum solution within a section of parameter space that is formed as a common region exterior to ellipsoidal or polyhedral constraint boundaries that share a common center but are typically not aligned.

As used herein, an "equi-brightness problem" refers to a formulation of the mask design problem in which the solution is defined by simultaneous requirements that it provide unit intensity at each of a number of points in the image at which the exposure is expected to be uniform.

As used herein, a "maximum contrast problem" refers to a formulation of the mask design problem in which the intensity of the brightest point in the dark portion of the image is minimized, subject to a requirement that several sampled points in the bright portion of the image have intensity above unity. Equivalently, the intensity of the dimmest of the several sampled bright points can be maximized while the intensity of all dark sample points is required to be below unity.

As used herein, a "maximum exposure latitude problem" refers to a formulation of the mask optimization problem in which the image must be adjusted to produce the largest possible percentage spread in the range of doses which keep the dimensions of the unit dose contour within tolerance.

As used herein, an "image metric" refers to a quantitative measure of the quality of an image.

As used herein, an "extrema solution" refers to a solution to an unconstrained problem in which the derivative of the objective with respect to a change in any variable is substantially zero.

As used herein, "overlaid exposure" refers to a mask image which is superposed on one or more previously exposed images in a photosensitive layer, or to an exposure step in which such a superposed mask image is formed.

As used herein, a "compressed basis" refers to coordinate dimensions for a solution space which are fewer in number than an initial set of solution space dimensions, but which substantially capture the important components of the image.

As used herein, an "edge bright point", also referred to as an edge-bright sample point, refers to a sample point on the perimeter of a bright exposed region which is intended to demarcate the perimeter of an integrated circuit feature when the exposed photosensitive material is developed.

As used herein, a "bright interior point" refers to a bright sample point which is located away from the edge-bright contour demarcating the bright region.

As used herein, a "dark perimeter point", also referred to as a dark perimeter sample point, refers to a dark sample point which is positioned within the dark portion of the image at a location adjacent to an edge-bright sample point, for example at a position that is offset into the dark region by a fixed distance.

As used herein, a "dark interior point" refers to a dark sample point which is not a dark perimeter sample point.

An aspect of the present disclosure is to use source mask optimization ("SMO") in order to devise masks and sources for printing wafers. SMO involves steps of mask optimization, source optimization, wavefront engineering and spatial-domain and frequency-domain joint optimization. One of the steps of mask optimization is to determine an efficient basis set, which the present disclosure shows how to do in the case of multiple exposure. Mask optimization further involves solving for the optimum mask or masks within the efficient basis.

Referring to FIG. 1, a source mask optimization (SMO) process may include a pattern specification step 100, a source initialization step 200, a mask optimization step 300, a source optimization step 400, a joint optimization step 500, a wavefront engineering step 600, and a spatial joint optimization step 700. Embodiments in which one or more of the above steps are omitted in the above sequence of steps for the SMO process can also be employed.

Referring to the pattern specification step 100, the desired circuit patterns are specified as an input to the problem of optimizing the lithographic fabrication of the circuit, as are the characteristics of the lithographic exposure tool to be employed to form the lithographic patterns for multiple exposure.

Referring to the source initialization step 200, at least one initial source shape is selected. Each of the at least one initial source shape may, for example, be chosen by methods well known in the art for choosing sources based on the desired circuit patterns and the exposure tool characteristics. If multiple exposures are used, an initial source is chosen for each exposure.

Besides the different masks used to form an image by superposing multiple exposures, patterns that are deployed in widely separated parts of the masks can be optimized in some embodiments. These mask patterns are sometimes referred to as separate masks.

Referring to the mask optimization step 300, a set of optimal image forming waves is chosen for each mask. Because these waves implicitly define the content of each mask, this step of source mask optimization is referred to as mask optimization, or "MO." Mask optimization is run separately for each circuit clip which is to be optimally printed. This optimization problem typically has an enormous number of local minima for each clip, making it extremely difficult to exhaustively test all local minima to search out the globally best solution.

To circumvent this problem several simplifications and heuristics are used. These include four sub-steps described in FIG. 2, which is described below.

Referring to the source optimization step 400, which is also referred to as "SO," once the optical wavefronts have been optimized against the mask optimization objective, the source shape or the source shapes are re-optimized using the global method described in A. E. Rosenbluth and N. Seong, "Global Optimization of the Illumination Distribution to Maximize Integrated Process Window," SPIE v.6154 Optical Microlithography XIX (2006): p. 61540H. Even though the mask optimization step 300 is preferably carried out independently for each clip being optimized, the source optimization step 400 should preferably consider all mask clips, since within each exposure all clips are illuminated by the same source having the same source shape.

Referring to the joint optimization step 500, the source and wavefront variables are all optimized together using a local optimizer, as described in A. E. Rosenbluth, S. Bukofsky, C. Fonseca, M. Hibbs, K. Lai, A. Molless, R. N. Singh, and A. K. K. Wong, "Optimum Mask and Source Patterns to Print a Given Shape," JM3 1, no. 1 (2002): p. 13 and A. E. Rosenbluth, D. O. S. Melville, K. Tian, S. Bagheri, J. Tirapu-Azpiroz, K. Lai, A. Waechter, T. Inoue, L. Ladanyi, F. Barahona, K. Scheinberg, M. Sakamoto, H. Muta, E. Gallagher, T. Faure, M. Hibbs, A. Tritchkov, and Y. Granik, "Intensive Optimization of Masks and Sources for 22 nm Lithography," in Optical Microlithography XXII, ed. Harry J. Levinson and Mircea V. Dusa (San Jose: 2009). This step accounts for interactions between the source and mask variables. Hence, this step is referred to as joint optimization, or "JO." The wavefront variables describe the patterns present in the optical content produced by the mask, which in the context of image formation can be understood as the spatial frequency content transmitted by the mask. For this reason the JO step is sometimes referred to as "frequency-domain joint optimization". In the case of multiple exposure, separate variables can be used to define the mask spatial frequencies and sources for each mask. Also, because the local optimization in JO step 500 uses the mask solutions of MO step 300 as starting points, the term "mask initialization" may also be used to refer to the mask optimization step 300.

Typically the simplified mask optimization objective will attempt to optimize the quality of the weakest feature in a defocused plane, under a relatively relaxed constraint on common exposure. Preferably, the solution is then re-optimized for common process window. To accomplish this, the SO step 400 and JO step 500 may optionally be iteratively repeated with both the constraint on common process window and a constraint on required total source intensity being steadily tightened throughout these iterations, until finally common window is used as the objective. These iterations are indicated by a looping flow arrow from the joint optimization step 500 to the source optimization step 400 and a regular flow arrow from the source optimization step 400 to the joint optimization step 500. After these iterations involving multiple looping of the SO step 400 and the JO step 500 are completed, the source solution, i.e., the solution for the source shape, is usually considerably improved over the initial source solution, i.e., the initial source shape.

It is desirable to repeat the mask optimization step 300 using the improved source shape. In a preferred embodiment, the source mask optimization flow chart employs the joint optimization step 500 and the mask optimization step 300 iteratively, as indicated by a looping flow arrow from the joint optimization step 500 to the mask optimization step 300. Typically each of the iterative sequences including the MO step 300, the SO step 400, and the JO step 500 is repeated two or three times in total.

Referring to the wavefront engineering step 600, when these iterations are completed an optimal set of imaging waves and an optimal source has been determined for each exposure. To produce these waves, an optimal set of mask polygons is designed that will diffract the optimal imaging wavefronts when illuminated by the optimal source. In order to obtain manufacturable polygons, some compromise in image quality may need to be made during the wavefront engineering step 600.

Referring to the spatial joint optimization step 700, to compensate for the compromise in image quality that may be introduced at the wavefront engineering step 600, one may readjust the mask polygons and the source variables in a step of joint local optimization, which is herein referred to as spatial domain joint optimization. In the case of multiple exposure separate variables can be used to define the polygons and sources for each mask. One may optionally apply this step only to the most critical features, and may further apply it to a larger set of clips without re-adjusting the source variables (a procedure we continue to refer to as spatial domain joint optimization for simplicity). One may also optionally apply a step of further optimizing the source against a larger set of clips without re-adjusting the mask variables.

Once the optimal source shapes and masks are determined employing the steps 100-700, a design for a set of masks is generated. The set of masks are designed to generate the optimal wavefront during exposure when illuminated by the illumination sources. The optimal source shapes and masks can be deployed in the lithographic exposure tool, and semiconductor wafers are exposed to print the circuit designs. Methods to convert the exposed image into circuit patterns using a photoresist layer and pattern-transfer processes are well-known in the art. When multiple exposures are employed each mask is sequentially projected onto the wafer using its associated source.

Figure 2:
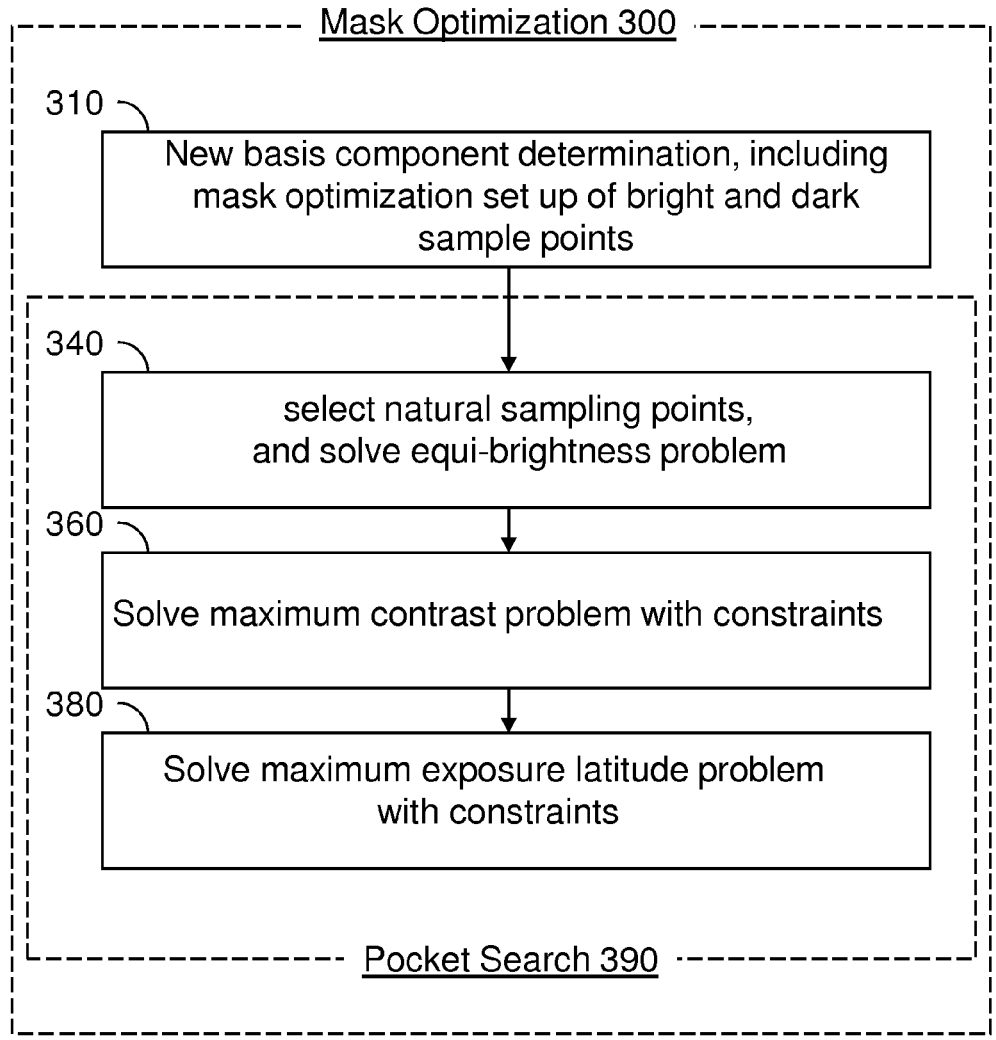
FIG. 2 is a flow chart showing the steps included in a mask optimization step 300 of FIG. 1 according to an embodiment of the present disclosure.

Referring to FIG. 2, the mask optimization step 300 is described in detail. The mask optimization step 300 includes four steps, which are a new basis component determination step 310, an equi-brightness problem solution step 340, a maximum contrast problem solution step 360, and a maximum exposure latitude problem solution step 380. The new basis component determination step 310 is further described below in reference to FIG. 3.

Steps 340, 360, and 380 collectively constitute a pocket search step 390, and provide optimum weights for the new basis components found in step 310. At the pocket search step 390, only the highest quality solution-space dimensions (i.e., the highest-quality wavefront degrees of freedom) are searched during pocket search. Optimal weights for the new basis components are generated. The optimally weighted new basis components maximize the primary objective function under conditions of constraint functions. These highest quality solution-space dimensions are determined by solving a simplified unconstrained version of the mask optimization problem. The quality of a solution to the unconstrained problem may be defined according to any standard lithographic metric, such as image contrast. An optimal wavefront is calculated by finding weights for the new set of basis components through minimizing the primary objective function. For example, the new set of basis components weighted by the optimal joint eigenvector weights can be added to form the optimal wavefront. Thus, the calculation of the optimal wavefront can be effected by performing a pocket search.

Referring to the equi-brightness problem solution step 340, heuristics such as the equi-brightness heuristic, or the step-walk linearized constraint method, are used to determine the most productive potential local minima to search. The equi-brightness heuristic is described in a copending application Ser. No. 12/463,742 filed on May 11, 2009. The step-walk linearized constraint method is described in A. E. Rosenbluth, D. Melville, K. Tian, K. Lai, N. Seong, D. Pfeiffer, and M. Colburn, "Global optimization of masks, including film stack design to restore TM contrast in high NA TCC's," in SPIE v.6520—Optical Microlithography XX, ed. Donis G. Flagello (2007), p. 65200P.

Referring to the maximum contrast problem solution step 360, a staged screening is used to test the local minima, meaning that an even-further-simplified objective is first used to evaluate the local minima, with only the most promising of these then re-evaluated using the MO objective.

Referring to the maximum exposure latitude problem solution step 380, a simplified quality objective (referred to as the mask optimization objective) is optimized, and the problem constraints are likewise simplified, allowing the solution to be obtained more quickly.

Each local minimum can be visualized in a compressed solution space in which each coordinate represents the weight given to a selected basis component (where in many cases more than 3 basis coordinates will be selected, making visualization somewhat abstract). More specifically, each local minimum can be visualized as a (typically high-dimensioned) pocket that is formed between the feasibility boundaries which the constraints define within the solution space. The solution space is typically compressed because only the highest quality (e.g. highest contrast) basis coordinates will be selected. Feasibility boundaries refer to the hypersurfaces within the solution space along which the intensity at bright sample points just reaches the required threshold level. For this reason the equi-brightness problem solution step 340, the maximum contrast problem solution step 360, and the maximum exposure latitude problem solution step 380 within the mask optimization step 300 are collectively referred to as a "pocket search step."

Figure 3A:
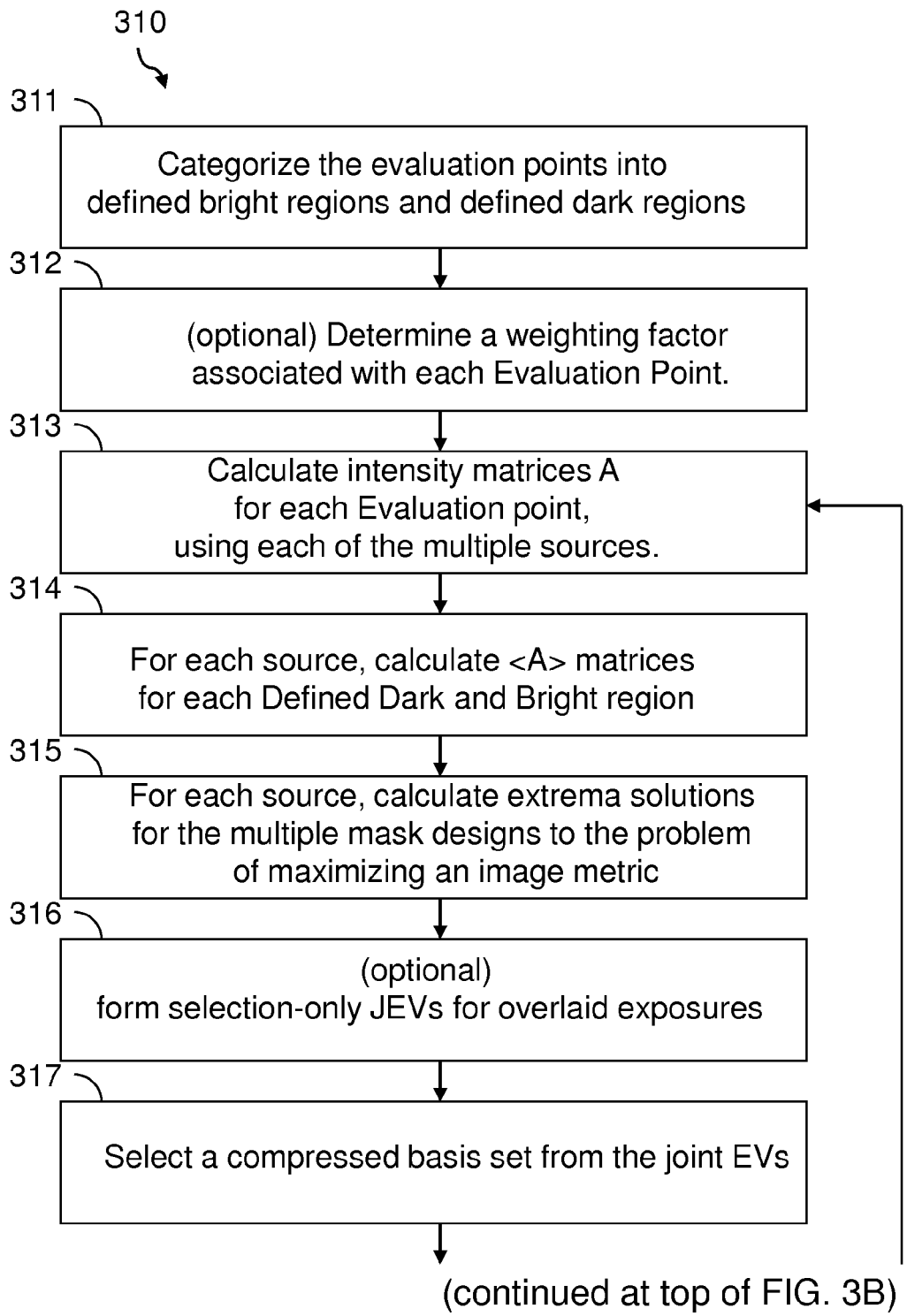
FIG. 3 is a flow chart showing the steps included in a joint eigenvector determination step 310 of FIG. 2 according to an embodiment of the present disclosure.
Figure 3B:
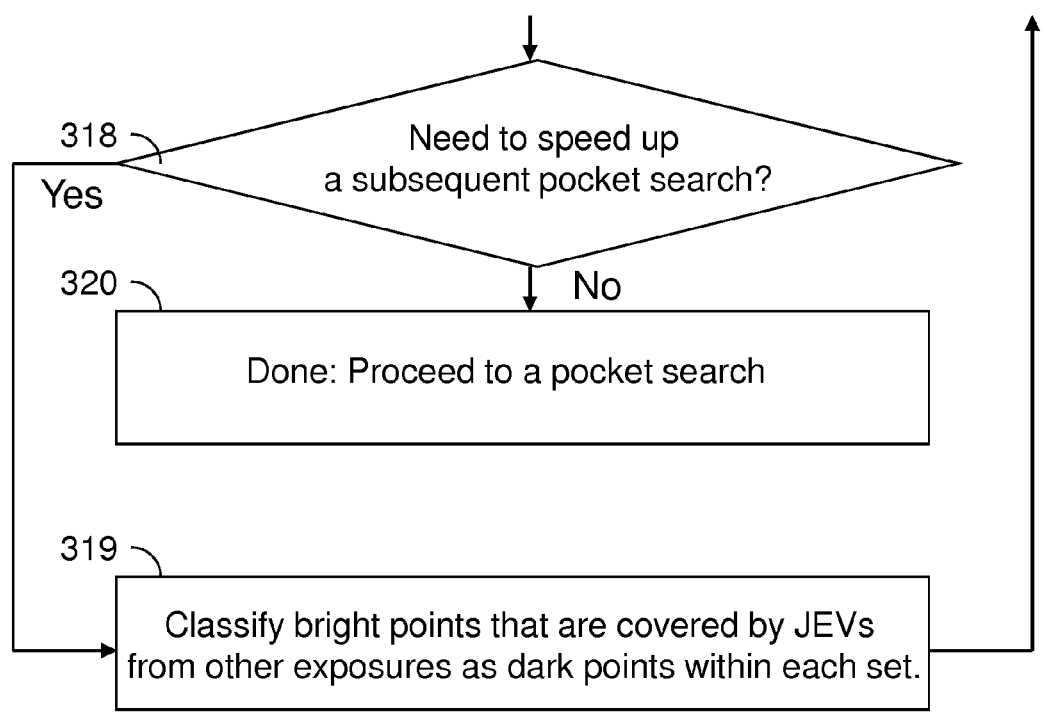

Referring to FIGS. 3A and 3B, lower level steps included in the new basis component determination step 310 are described in detail. Referring to step 311, for each exposure of a multiple exposure lithographic process, a set of basis functions are initially generated. The set of basis functions characterize the collected wavefront diffracted by each mask from a source.

A set of bright evaluation points and a set of dark evaluation points in an exposure plane are selected for a multiexposure lithographic process including a set of illumination sources. Evaluation points are laid out on a reference image plane (e.g. a surface of a wafer to be processed) at which the image will be formed using at least one exposure. The evaluation points are categorized as bright and dark evaluation points on the image. Note that in the case of multiple exposure these evaluation points are typically assigned based on the bright or dark character of the combined image. In this step it is generally not necessary to decompose the image into regions that are bright or dark in the individual exposures. The evaluation points can be selected and/or defined by employing an approximately uniform sampling density with a spacing that is finer than the resolution of the lithographic lens. Optionally, the intensity may be calculated at several different depths into the resist layer, or as an average through the resist thickness. If the depth direction is z, this means that the intensity may actually be evaluated in a number of different planes parallel to the x,y plane. However, all of these intensities would be evaluated at positions with the same x,y coordinates; only the z value would change. These x,y coordinates are those of the evaluation points that are laid out in the reference image plane.

The evaluation points can be categorized as sampling defined bright regions and defined dark regions. For example, the evaluation points can be categorized as edge bright points that sample intensity along the target contour of intensity at which edges of a photoresist would be formed if a circuit feature were reproduced in the photoresist with its designed shape (also referred to as its targeted shape), bright interior points corresponding to sample points inside of a bright region, dark perimeter points, and dark interior points. The bright region can be defined by an edge-bright contour representing the dividing perimeter boundary between bright and dark image regions, this boundary being also referred to as the target contour, with this edge-bright contour being sampled by bright points spaced at, for example, $0.25 \times \lambda/NA$, in which $\lambda$ is the wavelength of the illuminating radiation from the source, and NA refers to the numerical aperture of the source. The dark perimeter points can be defined as points located at a distance of, for example, $0.2 \times \lambda/NA$ from the edge-bright contour bright points and toward a dark region. The dark interior points are grid points in the dark region that are further away from the edge-bright contour than the dark perimeter points, and are typically located at a distance of, for example, $0.25 \times \lambda/NA$ from the dark perimeter points and toward the interior of the dark region.

If phase shift masks are not being employed, a third expanded selection step may then be carried out on each portion of the extrema solutions that is obtained from the same source. This step is undertaken to ensure that bright sample points can be covered with amplitude that is positive-signed, since the masks would have to employ phase shift if they needed to transmit substantial negative amplitude. Such positive-valued coverage is achieved by adding extrema solutions to the selection that provide additional positive-valued amplitude at bright points which the initial selection might only be able to cover with predominantly negative-valued amplitude. In doing so, one can preferably consider switching the sign of particular extrema solutions in order to achieve positive-valued coverage by means of the extrema solutions that are of highest quality.

During this step, an LP (Linear Program) or a MILP (Mixed Integer Linear Program) may be defined in which variables which may be integer allow the sign of each extremum solution to be switched within a linear approximation, or set to zero amplitude, and requirements are imposed that the amplitude with which each bright point is covered by the source be predominantly positive. By solving the LP or MILP to maximize contrast in the solutions that are selected with non-zero amplitude, the extrema solution set is expanded in the process to ensure that bright points can be covered by high quality extrema solutions without needing to resort to phase shift.

A set of basis components of candidate wavefronts is selected for each source to be used in forming an image at the set of bright evaluation points and the set of dark evaluation points. For example, to define the coverage we can scale each extremum solution such that the intensity at the dimmest bright point it covers is equal to 1, and then form a matrix C, which includes a row for each bright point and a column for each extremum solution. In the matrix C, matrix entries are rounded to zero if the bright point is not covered by the extremum solution, and to +1 or −1 for points that are covered, and the sign is chosen according to whether the extremum solution is predominantly positive or negative at the bright sample point. One can then define selection variables for the extremum solutions, denoted e, whose values may be restricted to the integers +1, 0, or −1, with 0 indicating "not selected", +1 indicating "selected", and −1 indicating "selected with reversed sign".

One can also add to the problem an additional set of coverage variables f that are associated with the e variables, with each f variable being linked to its associated e variable by a pair of constraints, $f \geq e$, and $f \geq -e$. The variables f should preferably be restricted to the range (0,1). As a condition for coverage we can require that $C \cdot e > \frac{1}{2}$, where the amplitude limit $\frac{1}{2}$ is considered to bound every element of the vector $C \cdot e$. If v is defined as a list of the reciprocals of the quality metrics of the extrema solutions raised to a power such as 2, one can use the linear program solver to minimize the quantity $f \cdot v$, in order to ensure coverage with high-quality extrema solutions. Any extremum solution whose f value is 1 in the solution should then be added to the selection set.

Referring to an optional weighting factor determination step 312, a point weighting factor associated with each evaluation point can be optionally determined. If the optional point weighting factor determination step 312 is omitted, all weighting factors can be 1.0. In a preferred embodiment, an area on the image plane associated with each evaluation point can be computed. For each of the defined bright regions and dark regions, fine grids can be formed in bright areas and dark areas around each evaluation point. Each point in the fine grids can be assigned to the nearest sample points. Gaussian or super-Gaussian weighting can be applied from each point in the fine grids, for example normalized to a total weighting of unity when summed over all sample points. An area-weight is generated for each evaluation point in proportion to its share of the weightings from all fine grid points.

Steps 313-317 illustrate exemplary methods that can be employed in one embodiment of the present disclosure. Mathematically equivalent methods can replace steps 313-317 described herein.

Referring to an intensity matrices calculation step 313, a set of intensity matrices A of the dimensionality of the set of basis functions is determined. A set of relationships between intensities of the set of bright evaluation points and the set of dark evaluation points and the set of weights of basis components of candidate wavefronts is generated. A set of intensity matrices A can be employed establish a relationship between the weights of the new basis components and the intensities at bright and dark points.

In one embodiment, the set of relationships can be expressed in quadratic form matrices. Specifically, each of the quadratic form matrices can be generated for an intensity at each bright evaluation point and each dark evaluation point in the exposure plane for each one of the set of illumination sources. Bases of the quadratic form matrices can include the set of basis components of the candidate wavefronts.

An intensity matrix A can be calculated for each evaluation point, using each of the sources of the multiple exposures. The intensity matrix A is defined by the equation $I = a^T A a$, wherein I is the intensity at the evaluation point, and the vector a contains the list of basis component weights, which may be amplitudes of diffracted orders of the interaction between the mask and source, and $a^T$ is a transpose of a. The list of amplitudes of diffracted orders of the interaction between the mask and source in a may be represented in spatial frequency, e.g., in spatial frequency Fourier variables. Alternatively it may be represented as the inverse Fourier transform of the spatial frequency amplitudes, thus representing the near field bandlimited mask transmission, sampled, for example, at a multiple of the Nyquist frequency which is one-half the wavelength divided by the numerical aperture. Diffraction order variables and Nyquist-spaced samples are examples of basis components for the wavefront. The intensity can be calculated under particular lithographic conditions, which include the type and thicknesses of a resist stack and the focus of the imaging lens.

In general, a primary objective function expressing a first merit quality for the intensities at the set of bright evaluation points and at the set of dark evaluation points can be generated. Constraint functions applied during the generation of the primary objective function are functions of the weights of the set of basis components of the candidate wavefronts.

For example, the intensity matrices A are calculated for each evaluation point, using each of the multiple sources, i.e., multiple exposures. The intensity matrices A include component matrices A', where A is given by a sum over j of $sj*A'j \cdot sj$ is an intensity weight of a j-th source direction. A'j represents the component matrix of the j-th source direction. $A'j_{,i,k}$, i.e., the element at the i-th row and the k-th column of A'j, represents the intensity of the interference pattern between the i-th and k-th basis components when illuminated from source direction j. When more than one exposure is used the illumination from a particular direction is assigned a separate value of j for each exposure. In addition, the illumination directions for each exposure are given contiguous values of j. $A'j_{,i,k}$ will typically be zero unless both the ith and kth basis components are wavefront components of the same exposure that source direction j is assigned to. When multiple exposures are used the intensity matrices A will therefore typically have a block diagonal form. Typically the source directions may extend to the full numerical aperture (NA) of the projection lens, in which case the span of diffraction orders collected across any sine-angular radius will approximately number $+/-2 \times p \times NA/\lambda$, in which p is the physical dimension of the field. One may consider the primary problem of mask optimization to be the determination of a wavefront solution which minimizes the average intensity in dark evaluation points while constraining the intensity at every bright evaluation point to be above a threshold value, such as unity.

Referring to steps 314 and 315, the primary objective function and the constraint functions are transformed into a secondary objective function that does not include constraints.

Referring to an average matrix calculation step 314, average matrices <A> can be calculated for each defined dark and bright region and for each source. One of the average matrices <A> is the average of intensity matrices A's for edge bright points and bright interior points, and another of the average matrices <A> is the average of intensity matrices A's for dark perimeter points and dark interior points. In one embodiment, a bright region average can be calculated from the A matrices by assigning a fixed percentage of weight to edge bright points. Preferably, the fixed percentage is at least 40% of the total weight. In another embodiment, a dark region average can be calculated from the A matrices by assigning a fixed percentage of weight to dark perimeter points. Preferably, this fixed percentage is at least 40% of the total weight.

Referring to an extrema solutions calculation step 315, extrema solutions for the secondary objective function are determined. Specifically, extrema solutions to the problem of maximizing an image metric are calculated for each source for the multiple mask designs. In one embodiment, the secondary objective function can be formed by taking a ratio of an average of the quadratic form matrices for the bright intensity points to an average of the quadratic form matrices for the dark intensity points. In this embodiment the image metric is average bright region intensity per unit dark region intensity, i.e., the average contrast. The average contrast is obtained as the ratio of the <A> quadratic forms for the bright and dark regions.

In one embodiment, each resulting solution is deemed to be a joint bright and dark eigenvector, which is also referred to as a "JEV," for the multiple exposure process. Each eigenvector is a linear combination of the elements of the vector a, and is jointly an eigenvector of the <A> quadratic forms for both the bright and dark regions, in a basis where the dark region <A> is scaled to provide unit intensity per unit magnitude of a. Mathematically, the resulting individual joint eigenvectors are a solution to the problem of solving the unconstrained optimization problem for all the sources, and can be obtained by simultaneously diagonalizing the <A> matrices for the bright and dark regions. A JEV will typically correspond to exposure with only one particular source of a multiple exposure process when the <A> matrices are block diagonal. The particular source involved is determined optimally in the unconstrained problem by the JEV. The JEV is generally found to put light in particular bright regions of the image, but there is no need to pre-assign any region of the image to exposure with the particular source; instead the JEV determines this in an optimal way.

Referring to an optional selection-only JEV formation step 316, selection-only JEVs can be formed for overlaid exposures by replacing list of sample point intensities by worst case intensity when offset by the level-to-level overlay accuracy tolerance in any direction. In one embodiment, a "robust" exposure mask, i.e., a mask that has JEVs with larger eigenvalues than other masks, or whose selected JEV having the smallest eigenvalue is larger than the smallest selected eigenvalues of other masks, is selected as a reference, and the other exposure masks are evaluated as to the effect of overlay variation between each of the other masks and the robust mask. The JEVs can be considered in order to compensate for such overlay variations by replacing their uncompensated intensities at sample points with the worst-case mis-overlaid intensities. A modified set of JEVs can be obtained by performing this optional step.

For example, joint eigenvectors that are produced by all sources other than a source that has highest joint eigenvalues can be modified to include a worst-case intensity change that overlay errors among the multiple exposures can produce at evaluation points. Further, a second set of ranking and exposure coverage criteria can then be applied to select a revised set of joint eigenvectors that has a highest overall ranking.

Referring to a compressed basis set selection step 317, the set of ranking criteria and coverage criteria that are used to select the preferred extrema solutions to the unconstrained problem may be based on recognized lithographic quality metrics, such as image contrast.

For example, an initial set of ranking and exposure coverage criteria can be applied to eigenvectors of the quadratic form matrices. A compressed basis set can be selected from the joint eigenvectors (JEVs) for all sources of the multiple exposures such that the intensity in bright regions reaches a threshold value, e.g., the average contrast, at all bright evaluation points. The compressed basis set includes a minimum number of eigenvectors based on the eigenvalues. The compressed basis set is selected under the constraint of maintenance of acceptable contrast. The constraint covers every bright point with maximum possible contrast as well as points having the intensity that do not excessively exceed the bright average.

A set of joint eigenvectors that has a highest overall ranking can be selected while achieving adequate exposure coverage of bright evaluation points. Some specific steps that may be used when image contrast is used as a quality metric are as follows. First, one may rule out any JEV whose average contrast is deemed immediately inadequate; for example those JEVs whose contrast is below a threshold of 1. Next, for each bright point, one may consider as candidates those JEVs which provide sufficient intensity at the bright point (for example, intensity above unity, referred to as a bright threshold of unity), so long as the JEV does not provide dramatically larger intensity at some other bright point than at the bright point in question, for example more than twice as much intensity. If no candidates are available, one may adjust the immediate rejection criterion for dark region intensity. From among these candidates, one may select the JEV whose average contrast (joint eigenvalue) is largest (unless this JEV has already been selected). This is repeated for each bright evaluation point. In addition one may check that there are no bright points such that the dimmest JEVs which provide intensity above the bright threshold at the point are much brighter than the brightest intensity provided by at least one selected JEV at any other bright point, for example more than twice as bright. Such an imbalance in the intensities with which JEVs cover bright points may be remedied by selecting additional JEVs that equalize the intensity coverage.

Referring to a decision step 318, a determination is made as to whether a subsequent pocket search needs to be accelerated. If there is a need to speed up the subsequent pocket search, the process flow proceeds to step 319. If there is no need to speed up the subsequent pocket search, the process flow proceeds to step 320, which concludes the joint eigenvector determination step 310. The process flow can proceed to the pocket search step 390 as shown in FIG. 2.

After these final selection steps are completed the minimal set of extrema solutions then serves as a space of reduced dimensionality within which to maximize the primary objective under constraints. The space typically has reduced dimensionality because only the highest quality extrema solutions will generally be selected. The primary objective function is expressed employing the extrema solutions as a new set of basis components.

Referring to a point reclassification step 319, multiple sets of sample points are formed such that the multiple sets correspond to the different exposures. Bright points that are covered by JEVs from other exposures are reclassified as dark points within each set. The process flow then proceeds to the intensity matrices calculation step 313.

While the present disclosure has been described in terms of specific embodiments, it is evident in view of the foregoing description that numerous alternatives, modifications and variations will be apparent to those skilled in the art. Accordingly, the present disclosure is intended to encompass all such alternatives, modifications and variations which fall within the scope and spirit of the present disclosure and the following claims.

What is claimed is:

1. A method for generating a design for at least one mask for a lithographic process, said method comprising:
a first step of selecting a set of bright evaluation points and a set of dark evaluation points in an exposure plane for a multiexposure lithographic process comprising a set of illumination sources and a set of basis components of candidate wavefronts for each source to be used in forming an image at said set of bright evaluation points and said set of dark evaluation points;
a second step of generating a set of relationships between intensities of said set of bright evaluation points and said set of dark evaluation points and weightings of said set of basis components of candidate wavefronts;
a third step of generating a primary objective function expressing a first merit quality for said intensities at said set of bright evaluation points and at said set of dark evaluation points and said weightings of said set of basis components, wherein constraint functions applied during said generating are functions of said weightings of said set of basis components of said candidate wavefronts;
a fourth step of transforming said primary objective function and said constraint functions into a secondary objective function that does not include constraints;
a fifth step of determining extrema solutions for said secondary objective function;
a sixth step of expanding said extrema solutions so that bright points are covered by expanded extrema solutions without resorting to phase shift;
a seventh step of generating an expression of said primary objective function by employing said extrema solutions as a new set of basis components;
an eighth step of calculating an optimal wavefront by finding weights for said new set of basis components through minimizing said primary objective function;
a ninth step of generating a design for at least one mask, wherein said at least one mask generates said optimal wavefront during exposure when illuminated by said illumination sources, wherein at least one step among said second, third, fourth, fifth, sixth, seventh, eighth, and ninth steps is performed employing a machine configured to run a program for performing each corresponding step.

2. The method of claim 1, further comprising:
generating optimal new basis component weights that maximize said primary objective function under conditions of said constraint functions; and
adding said new set of basis components weighted by said optimal basis components weights to form said optimal wavefront.

3. The method of claim 1, wherein said generating of said set of relationships is effected by generating quadratic form matrices, wherein each of said quadratic form matrices is generated for an intensity at each bright evaluation point and each dark evaluation point in said exposure plane for each one of said set of illumination sources, wherein bases of said quadratic form matrices comprise said set of basis components of said candidate wavefronts.

4. The method of claim 3, wherein said secondary objective function is formed by taking a ratio of an average of said quadratic form matrices for said bright intensity points to an average of said quadratic form matrices for said dark intensity points.

5. The method of claim 4, wherein said determining of said extrema solutions is effected by generating joint eigenvectors of said averaged quadratic form matrices.

6. The method of claim 5, further comprising applying an initial set of ranking and exposure coverage criteria to eigenvalues of said averaged quadratic form matrices.

7. The method of claim 6, further comprising selecting a set of joint eigenvectors that has a highest overall ranking while achieving adequate exposure coverage of bright evaluation points.

8. The method of claim 7, further comprising modifying joint eigenvectors that are produced by all sources other than a source that has highest joint eigenvalues to include a worst-case intensity change that overlay errors among the multiple exposures can produce at evaluation points.

9. The method of claim 8, further comprising applying a second set of ranking and exposure coverage criteria to select a revised set of joint eigenvectors that has a highest overall ranking.

10. The method of claim 1, wherein said calculating of said optimal wavefront is effected by performing a pocket search.

11. The method of claim 10, wherein said performing of said pocket search includes:
  solving an equi-brightness problem;
  solving a maximum contrast problem; and
  solving a maximum exposure latitude problem.

12. The method of claim 1, further comprising adding at least one solution to said extrema solutions, wherein said added at least one solution provides additional positive-valued amplitude at bright points at which preexisting extrema solutions cover with predominantly negative-valued amplitude.

13. The method of claim 1, further comprising determining whether a subsequent pocket search needs to be accelerated.

14. The method of claim 13, further comprising:
  forming multiple sets of sample points wherein said multiple sets correspond to the different exposures; and
  reclassifying at least one bright point as dark points within each set.

15. A method of forming a lithographic pattern on a substrate, said method comprising:
  selecting a set of bright evaluation points and a set of dark evaluation points in an exposure plane for a multiexposure lithographic process comprising a set of illumination sources and a set of basis components of candidate wavefronts for each source to be used in forming an image at said set of bright evaluation points and said set of dark evaluation points;
  generating a set of relationships between intensities of said set of bright evaluation points and said set of dark evaluation points and weightings of said set of basis components of candidate wavefronts;
  generating a primary objective function expressing a first merit quality for said intensities at said set of bright evaluation points and at said set of dark evaluation points and said weightings of said set of basis components, wherein constraint functions applied during said generating are functions of said weightings of said set of basis components of said candidate wavefronts;
  transforming said primary objective function and said constraint functions into a secondary objective function that does not include constraints;
  determining extrema solutions for said secondary objective function;
  expanding said extrema solutions so that bright points are covered by expanded extrema solutions without resorting to phase shift;
  generating an expression of said primary objective function by employing said extrema solutions as a new set of basis components;
  calculating an optimal wavefront by finding weights for said new set of basis components through minimizing said primary objective function;
  generating a design for a set of masks, wherein said set of masks generates said optimal wavefront during exposure when illuminated by said illumination sources; and
  lithographically patterning a photoresist on a substrate, wherein said photoresist is patterned by employing multiple exposures in which at least two masks among said set of masks are employed.

16. The method of claim 15, further comprising:
  generating optimal new basis components that maximize said primary objective function under conditions of said constraint functions; and
  adding said new set of basis components weighted by said optimal joint eigenvector weights to form said optimal wavefront.

17. The method of claim 15, wherein said generating of said set of relationships is effected by generating quadratic form matrices, wherein each of said quadratic form matrices is generated for an intensity at each bright evaluation point and each dark evaluation point in said exposure plane for each one of said set of illumination sources, wherein bases of said quadratic form matrices comprise said set of basis components of said candidate wavefronts.

18. The method of claim 15, wherein said calculating of said optimal wavefront is effected by performing a pocket search.

19. The method of claim 15, further comprising adding at least one solution to said extrema solutions, wherein said added at least one solution provides additional positive-valued amplitude at bright points at which preexisting extrema solutions cover with predominantly negative-valued amplitude.

20. A method for manuacturing at least one mask for a lithographic process, said method comprising of:
  a first step of selecting a set of bright evaluation points and a set of dark evaluation points in an exposure plane for a multiexposure lithographic process comprising a set of illumination sources and a set of basis components of candidate wavefronts for each source to be used in forming an image at said set of bright evaluation points and said set of dark evaluation points;
  a second step of generating a set of relationships between intensities of said set of bright evaluation points and said set of dark evaluation points and weightings of said set of basis components of candidate wavefronts;
  a third step of generating a primary objective function expressing a first merit quality for said intensities at said set of bright evaluation points and at said set of dark evaluation points and said weightings of said set of basis components, wherein constraint functions applied during said generating are functions of said weightings of said set of basis components of said candidate wavefronts;
  a fourth step of transforming said primary objective function and said constraint functions into a secondary objective function that does not include constraints;
  a fifth step of determining extrema solutions for said secondary objective function;
  a sixth step of expanding said extrema solutions so that bright points are covered by expanded extrema solutions without resorting to phase shift;
  a seventh step of generating an expression of said primary objective function by employing said extrema solutions as a new set of basis components;
  an eighth step of calculating an optimal wavefront by finding weights for said new set of basis components through minimizing said primary objective function;

a ninth step of generating a design for at least one mask, wherein said at least one mask generates said optimal wavefront during exposure when illuminated by said illumination sources, wherein at least one step among said second, third, fourth, fifth, sixth, seventh, eighth, and ninth steps is performed employing a machine configured to run a program for performing each corresponding step; and a tenth step of manufacturing at least one lithographic mask for a lithographic process, wherein each of said at least one lithographic mask replicates a set of patterns in said design for said at least one mask.

* * * * *